United States Patent
Ranaweera et al.

(10) Patent No.: US 6,713,369 B1
(45) Date of Patent: Mar. 30, 2004

(54) ANTIFUSE INCORPORATING TANTALUM NITRIDE BARRIER LAYER

(75) Inventors: Jeewika Ranaweera, San Jose, CA (US); Roy Lambertson, Mountainview, CA (US)

(73) Assignee: Actel Corporation, Mountain View, CA (US)

( * ) Notice: Subject to any disclaimer, the term of this patent is extended or adjusted under 35 U.S.C. 154(b) by 0 days.

(21) Appl. No.: 10/157,777

(22) Filed: May 28, 2002

Related U.S. Application Data

(62) Division of application No. 09/741,374, filed on Dec. 18, 2000, now Pat. No. 6,603,142.

(51) Int. Cl.[7] ........................ H01L 21/326; H01L 21/479
(52) U.S. Cl. ............................................. 438/467
(58) Field of Search ....................................... 438/467

(56) References Cited

U.S. PATENT DOCUMENTS

| | | | |
|---|---|---|---|
| 4,899,205 A | 2/1990 | Hamdy et al. | 357/51 |
| 5,008,855 A | 4/1991 | Eltoukhy et al. | 365/96 |
| 5,126,282 A | 6/1992 | Chiang et al. | 437/172 |
| 5,272,101 A | 12/1993 | Forouhi et al. | 437/50 |
| 5,272,388 A | 12/1993 | Bakker | 307/202.1 |
| 5,308,795 A | 5/1994 | Hawley et al. | 437/195 |
| 5,614,756 A | 3/1997 | Forouhi et al. | 257/530 |
| 5,705,849 A | 1/1998 | Zheng et al. | 257/530 |
| 5,741,720 A | 4/1998 | Hawley et al. | 437/60 |
| 5,920,109 A | 7/1999 | Hawley et al. | 257/530 |
| 5,962,910 A | 10/1999 | Hawley et al. | 257/530 |
| 6,107,165 A * | 8/2000 | Jain et al. | 438/467 |
| 6,124,194 A | 9/2000 | Shao et al. | 438/600 |

* cited by examiner

*Primary Examiner*—W. David Coleman
(74) *Attorney, Agent, or Firm*—Sierra Patent Group, Ltd.

(57) ABSTRACT

A method for forming a metal-to-metal antifuse disposed above and insulated from a semiconductor substrate is disclosed. The method comprises forming a first metal layer disposed above and insulated from the semiconductor substrate; forming a layer of antifuse material over and in electrical contact with the first metal layer; forming a second metal layer over and in electrical contact with the layer of antifuse material; and forming at least one barrier layer comprising a layer of TaN between the layer of antifuse material and one of the first and second metal layers.

7 Claims, 3 Drawing Sheets

ANTIFUSE INCORPORATING TANTALUM NITRIDE BARRIER LAYER

PRIORITY CLAIM

This application is a divisional of U.S. patent application Ser. No. 09/741,374 filed Dec. 18, 2000 now U.S. Pat. No. 6,603,142.

BACKGROUND OF THE INVENTION

1. Field of the Invention

The present invention relates to antifuses. More particularly, the present invention relates to metal-to-metal antifuses incorporating improved barrier metal layers.

2. The Prior Art

Antifuses are known in the art and find applications in such devices as field programmable gate array (FPGA) integrated circuits in which they are used to program logic module functions and wiring interconnections. An antifuse comprises a pair of conductors spaced apart by an antifuse material which may include a single layer or may include multiple layers.

An antifuse initially exhibits an extremely high resistance between the pair of conductors. An antifuse is programmed by placing a programming potential across the pair of conductors to disrupt the antifuse material and create at least one conductive filament formed from the material from one or both electrodes to provide a low-resistance path between the pair of conductors.

Antifuses are characterized as either substrate antifuses, in which the lower conductor comprises a doped region in a semiconductor substrate and the upper conductor comprises a material such as a metal or polysilicon layer, or metal-to-metal antifuses, in which both the conductors comprise metal layers disposed above the surface of the semiconductor substrate. Substrate antifuses typically employ one or more silicon dioxide and silicon nitride layers as the antifuse material. Metal-to-metal antifuses typically employ a layer of amorphous silicon bounded by TiN diffusion barrier layers as the antifuse material.

Metal-to-metal antifuses have several advantages. They exhibit a lower on resistance than do substrate antifuses. The lower resistance permits higher speed operation of devices that employ them. In addition, because metal-to-metal antifuses are disposed in metal layers lying above the semiconductor substrate, they do not consume any substrate area and can be formed directly above active devices in the substrate, providing substantial savings in chip area.

Presently-employed metal-to-metal antifuses are subject to certain disadvantages which cause serious design constraints. When employed in circuits where substantial currents flow through the metal-to-metal antifuse during its use after programming, the antifuse can "switch off" due to thermally activated processes such as stress voiding and metal electromigration. As a result of this limitation, metal-to-metal antifuses cannot easily be employed in higher current DC paths, such as in Vcc and Vss lines. In addition, care must be taken to design signal paths that do not exceed an upper limit of peak AC current flow through the programmed metal-to-metal antifuse.

BRIEF DESCRIPTION OF THE INVENTION

A method for forming a metal-to-metal antifuse disposed above and insulated from a semiconductor substrate is disclosed. The method comprises forming a first metal layer disposed above and insulated from the semiconductor substrate, forming a layer of antifuse material over and in electrical contact with the first metal layer, forming a second metal layer over and in electrical contact with the layer of antifuse material, and forming at least one barrier layer comprising a layer of TaN between the layer of antifuse material and one of the first and second metal layers.

BRIEF DESCRIPTION OF THE DRAWING FIGURES

DETAILED DESCRIPTION OF THE INVENTION

Those of ordinary skill in the art will realize that the following description of the present invention is illustrative only and not in any way limiting. Other embodiments of the invention will readily suggest themselves to such skilled persons.

Figure 1:
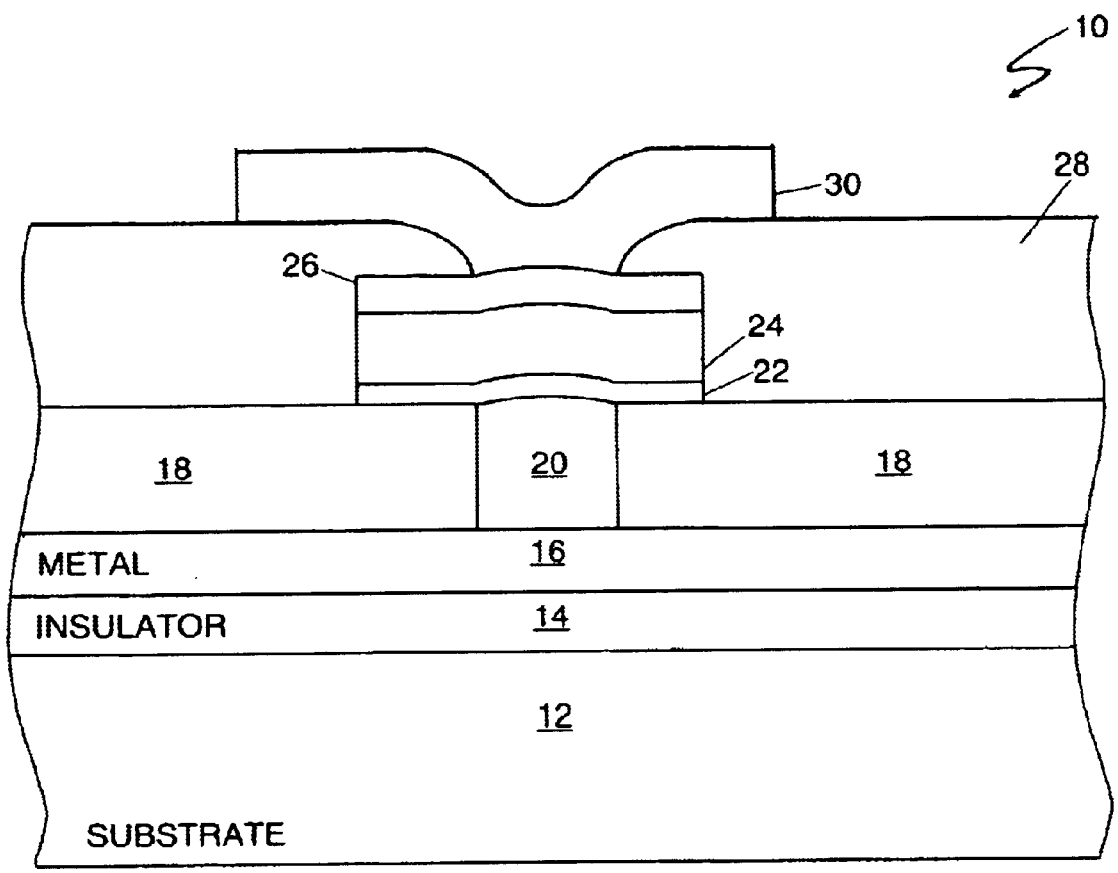
FIG. 1 is a cross-sectional view of an illustrative antifuse according to the present invention.

Referring first to FIG. 1, a cross-sectional view is shown of an illustrative antifuse according to the present invention. The antifuse of FIG. 1 is generalized in that it shows the relationships between the layers that comprise the device to provide a disclosure herein. The specific geometric arrangement of the device as in FIG. 1 is an example of an antifuse employing tungsten plug antifuse technology, but persons of ordinary skill in the art will readily appreciate that the specific geometry employed for the antifuse of the present invention could be any of the known structural arrangements for metal-to-metal antifuses, other illustrative and non-exhaustive examples of which are shown in U.S. Pat. No. 5,272,101 to Forouhi et al., U.S. Pat. No. 5,308,795 to Hawley et al., U.S. Pat. No. 5,614,756 to Forouhi et al., U.S. Pat. No. 5,920,109 to Hawley et al., and U.S. Pat. No. 5,962,910 to Hawley et al. In addition, the present invention is disclosed using the terms "first metal layer" and "second metal layer" in which terms persons of ordinary skill in the art will understand the words "first" and "second" to be relative, not absolute. The antifuse of the present invention may be disposed between any two metal layers in an integrated circuit.

Antifuse 10 in FIG. 1 is disposed above semiconductor substrate 12 and insulated therefrom by insulating layer 14, which may be, for example, thermally grown or deposited silicon dioxide. A portion of a first metal layer 16 is disposed over insulating layer 14. An intermetal dielectric layer 18 separates the first metal layer in the integrated circuit from overlying metal layers in the integrated circuit.

A metal plug 20 (formed from a material such as tungsten) disposed in an aperture formed in the intermetal dielectric layer 18 is electrically coupled to the first metal layer 16. A first TaN barrier layer 22 is disposed over and in electrical contact with the tungsten plug 20, although in some embodiments of antifuses according to the present invention, the first TaN barrier layer may be omitted. A layer of antifuse material 24 is disposed over the first barrier layer and a second TaN barrier layer 26 is disposed over the layer of antifuse material 24. Another insulating layer 28 is disposed over the antifuse stack of elements 22, 24, and 26. A second metal layer 30 is disposed over insulating layer 28 and in electrical contact with the second TaN barrier layer 22 through a via in insulating layer 28 to form the upper conductor of the antifuse.

As will be appreciated by persons of ordinary skill in the art, other layers may be formed over the upper conductor of the antifuse in order to complete the fabrication of the integrated circuit device containing the antifuse of the present invention.

The antifuse of the present invention is programmed by placing a programming potential Vpp across the upper and lower conductors of the antifuse. The programming potential disrupts the antifuse layer and forms a conductive filament formed from the barrier layer material. As will be readily understood by persons of ordinary skill in the art, the magnitude of Vpp will depend upon the thicknesses of the various layers in the antifuse. Numerous programming sequences for antifuses are well known in the art. Non-exhaustive examples of such antifuse programming methods are shown in U.S. Pat. No. 5,741,720 to Hawley et al., U.S. Pat. No. 4,899,205 to Hamdy et al. U.S. Pat. No. 5,008,855 to Eltoukhy et al., U.S. Pat. No. 5,126,282 to Chiang et al. and U.S. Pat. No. 5,272,3388 to Bakker.

It has been predicted that programmed antifuses according to the present invention are much less susceptible to reverting back to an open-circuit, a condition known as "healing". It has been predicted that, for the same programming current, programmed antifuses according to the present invention employing TaN barrier layers exhibit conductive filaments having substantially larger radii than those of antifuses employing other barrier materials such as TiN. In addition, the conductive filaments of antifuses fabricated according to the present invention are more stable at device operating temperatures than are the conductive filaments of other antifuses.

Figure 2A:
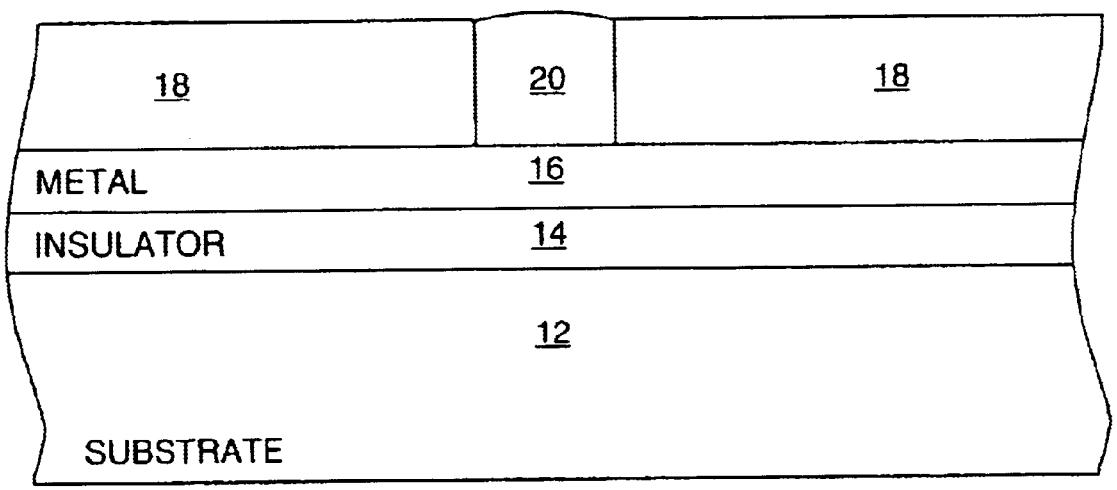
FIGS. 2A through 2C are cross-sectional views of an illustrative antifuse according to the present invention showing the structure at different points during its fabrication process.
Figure 2B:
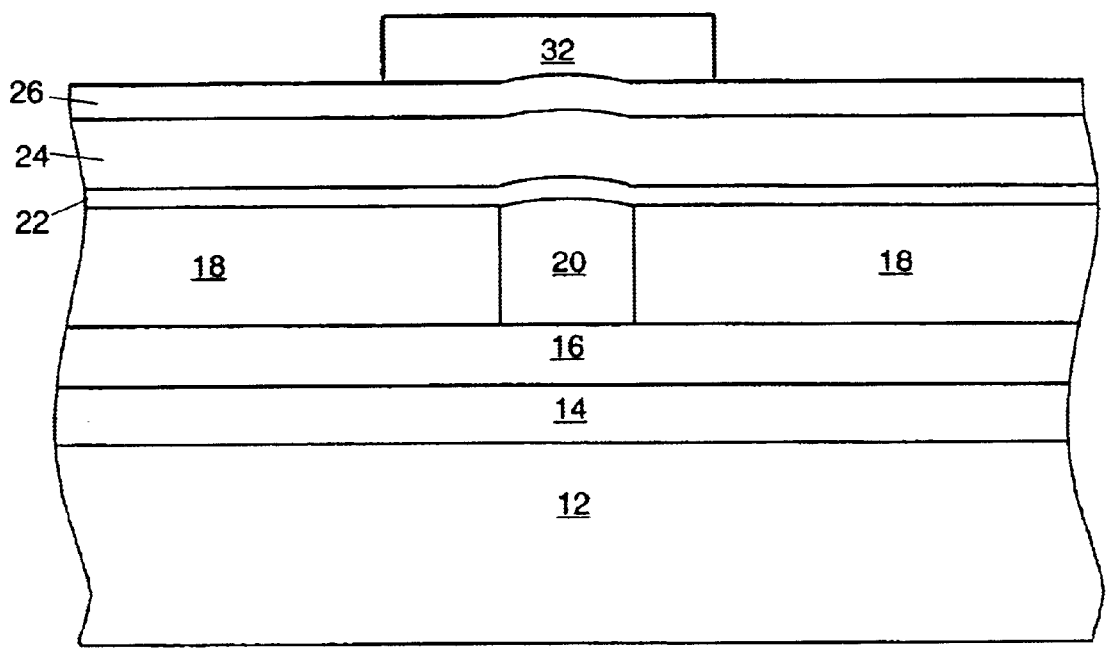
Figure 2C:
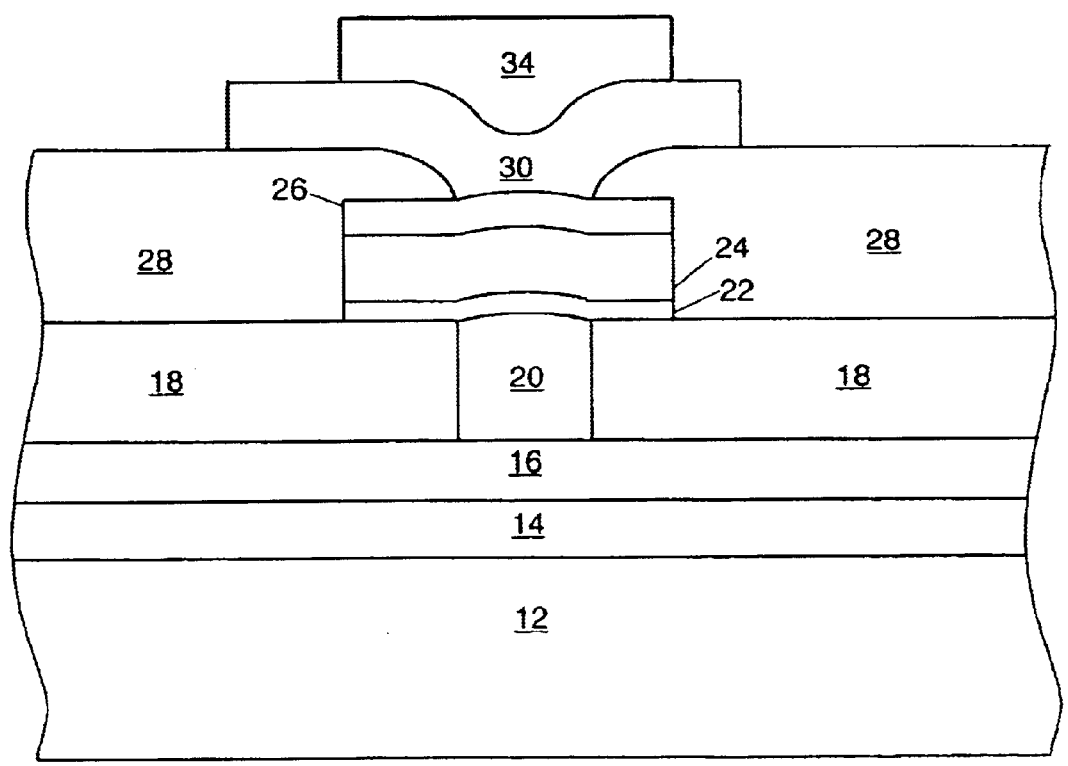

Referring now to FIGS. 2A through 2C, a method according to the present invention for fabricating antifuses as disclosed herein will be illustrated. Referring now to FIG. 2A, the integrated circuit to contain the antifuse according to the present invention has been processed to the point where the tungsten plug has been formed and the top of the tungsten plug and the upper surface of the intermetal dielectric have been planarized using conventional semiconductor processing techniques. Thus FIG. 2A shows the semiconductor substrate 12 covered by insulating layer 14, first metal layer 16 and deposited intermetal dielectric layer 18. A via has been formed in intermetal dielectric layer 18 and tungsten plug 20 has been formed and the upper exposed surface planarized using conventional semiconductor processing techniques. In a typical structure shown in FIG. 2A, insulating layer 14 may have a thickness in the range of between about 400 nm and about 800 nm, first metal layer 16 may have a thickness in the range of between about 400 nm and about 800 nm, and intermetal dielectric layer 18 may have a thickness in the range of between about 400 nm and about 800 nm.

Referring now to FIG. 2B, first TaN barrier layer 22 having a thickness in the range of between about 20 nm and about 200 nm may be formed over the top surface of the tungsten plug 20 using known CVD or PVD techniques. Next, an antifuse layer 24 of material such as amorphous silicon having a thickness in the range of between about 20 nm and about 100 nm is formed over the top surface of the TaN barrier layer 22 using CVD or PE-CVD techniques. Persons of ordinary skill in the art will appreciate that materials other than amorphous silicon may be employed for the antifuse layer. As previously mentioned, the first TaN barrier layer 22 is optional according to the present invention and may be omitted. In such an embodiment, the antifuse layer 24 is formed directly over the tungsten plug 20. Finally, second TaN barrier layer 26 having a thickness in the range of between about 20 nm and about 200 nm may be formed over the top surface of the tungsten plug using known CVD or PVD techniques. Next, the antifuse stack is patterned and defined using conventional photolithographic and etching techniques. FIG. 2B shows the structure immediately prior to etching after a masking layer 32 has been applied and developed.

Referring now to FIG. 2C, the antifuse stack has been etched and masking layer 32 has been removed. An insulating layer 28, comprising, for example silicon dioxide, having a thickness in the range of between about 200 nm and about 300 nm is formed over the stacked structure using conventional deposition techniques. A metal layer 30 having a thickness in the range of between about 400 nm and about 800 nm is formed over the top of the insulating layer 28 using conventional metallization techniques as shown in FIG. 2C.

Metal layer 30 is patterned and defined to form the upper antifuse conductor as well as other structures elsewhere on the integrated circuit using conventional photolithographic and etching techniques. FIG. 3C shows the structure immediately prior to the metal etch processing step after masking layer 34 has been applied using conventional photolithographic techniques.

FIG. 1 shows the completed antifuse structure after the etching step used to define the metal layer 28 after the masking layer 34 has been removed using conventional photolithographic techniques.

Figure 3:
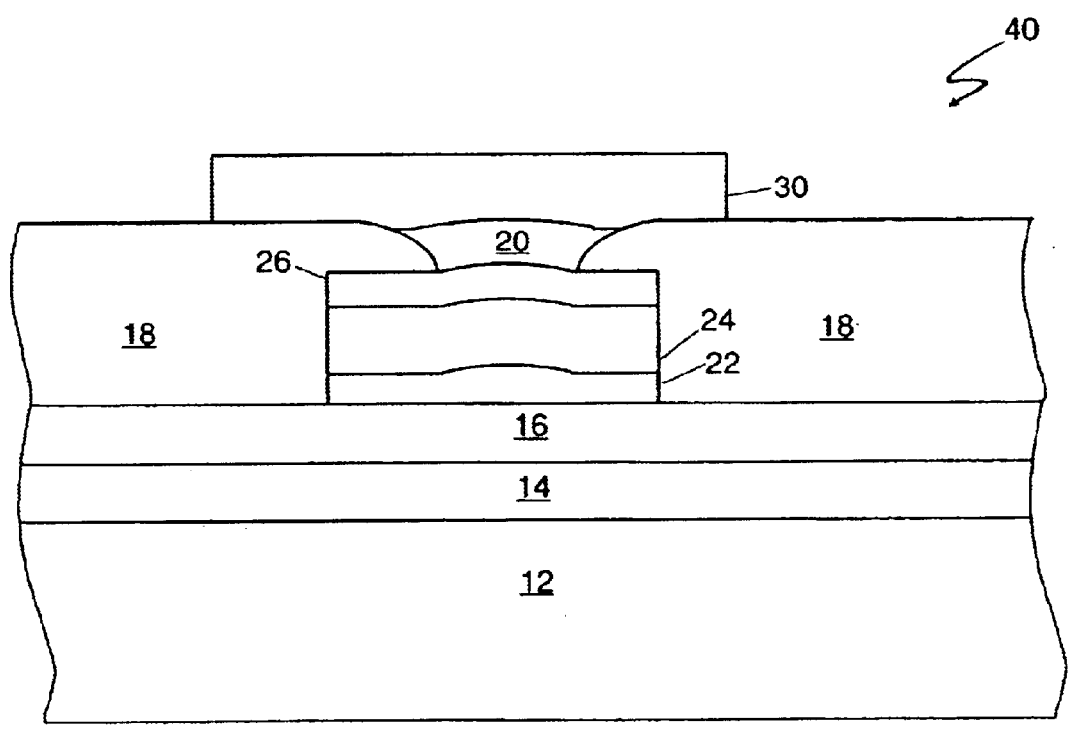
FIG. 3 is a cross-sectional view of another illustrative antifuse according to the present invention.

Referring now to FIG. 3, another embodiment of an antifuse according to the present invention is shown in cross sectional view. Elements of the structure in FIG. 3 that correspond to elements in the embodiment of FIG. 1 will be given the same reference numerals. Antifuse 40 is disposed above semiconductor substrate 12 and insulated therefrom by insulating layer 14, which may be, for example, thermally grown or deposited silicon dioxide. A portion of a first metal layer 16 is disposed over insulating layer 14. A first TaN barrier layer 22 is disposed over and in electrical contact with the first metal layer 16. A layer of antifuse material 24 is disposed over the first barrier layer and a second TaN barrier layer 26 is disposed over the layer of antifuse material 24, although in some embodiments of antifuses according to the present invention, the second TaN barrier layer 26 may be omitted An intermetal dielectric layer 18 separates the first metal layer in the integrated circuit from overlying metal layers in the integrated circuit.

A tungsten plug 20 disposed in an aperture formed in the intermetal dielectric layer 18 is planarized with the top surface of intermetal dielectric layer 18 and is electrically coupled to the layer of antifuse material 24. A second metal layer 30 is disposed over intermetal dielectric layer 18 and in electrical contact with the tungsten plug 20 through a via in intermetal dielectric layer 18 to form the upper conductor of the antifuse.

The process used to fabricate the antifuse 40 of FIG. 3 is similar to that described herein for the fabrication of antifuse 10 of FIG. 1, except that the barrier layer and antifuse stack is formed prior to the formation of the intermetal dielectric layer, thus eliminating the need to form a second dielectric layer as in the embodiment of FIG. 1.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A method for forming a metal-to-metal antifuse disposed above and insulated from a semiconductor substrate, comprising:

forming a first metal layer disposed above and insulated from the semiconductor substrate;

forming a layer of antifuse material over and in electrical contact with said first metal layer;

forming a second metal layer over and in electrical contact with said layer of antifuse material; and forming at least one barrier layer comprising a layer of TaN between said layer of antifuse material and said first metal layers.

2. A method for fabricating a metal-to-metal antifuse comprising:

forming a first metal electrode disposed above and insulated from the semiconductor substrate;

forming a first insulating layer over said first metal electrode;

forming a via in said first insulating layer and forming and planarizing a metal plug therein;

forming a layer of antifuse material over and in electrical contact with said metal plug;

forming a barrier layer comprising a layer of TaN over said layer of antifuse material;

defining said layer of antifuse material and said barrier layer;

forming a second insulating layer over said layer of antifuse material and said barrier layer and forming a via therein; and forming a second metal electrode over said second insulating layer and in said via in electrical contact with said barrier layer.

3. The method of claim 2, further including forming an additional barrier layer comprising a layer of TaN between said metal plug and said layer of antifuse material.

4. The method of claim 2, wherein said metal plug is a tungsten plug.

5. A method for fabricating a metal-to-metal antifuse comprising:

forming a first metal electrode disposed above and insulated from the semiconductor substrate;

forming a barrier layer comprising a layer of TaN over said first metal electrode;

forming a layer of antifuse material over said barrier layer;

defining said barrier layer and said layer of antifuse material;

forming an insulating layer over said barrier layer and said layer of antifuse material;

forming a via in said insulating layer and forming and planarizing a metal plug therein; and forming a second metal electrode over said insulating layer and in said via in electrical contact with said metal plug.

6. The method of claim 5, further including forming an additional barrier layer comprising a layer of TaN between said metal plug and said layer of antifuse material.

7. The method of claim 5, wherein said metal plug is a tungsten plug.

* * * * *